United States Patent
Golshan et al.

[11] Patent Number: 5,872,796
[45] Date of Patent: Feb. 16, 1999

[54] METHOD FOR INTERFACING BOUNDARY-SCAN CIRCUITRY WITH LINEARIZED IMPEDANCE CONTROL TYPE OUTPUT DRIVERS

[75] Inventors: Farideh Golshan, Mountain View; Marc E. Levitt, Sunnyvale, both of Calif.

[73] Assignee: Sun Microsystems, Inc., Palo Alto, Calif.

[21] Appl. No.: 885,054

[22] Filed: Jun. 30, 1997

[51] Int. Cl.$^6$ .................................................. G06F 11/00
[52] U.S. Cl. .......................................................... 371/22.32
[58] Field of Search ............................ 371/22.31, 22.32, 371/22.33, 22.5, 22.6, 25.1, 27.1; 395/183.06

[56] References Cited

U.S. PATENT DOCUMENTS 5,684,721  11/1997  Swoboda et al. ....................... 395/500
5,774,473   6/1998  Harley ..................................... 395/183

*Primary Examiner*—Vincent P. Canney
*Attorney, Agent, or Firm*—The Law Offices of Bever & Hoffman, LLP

[57] ABSTRACT

A method for coupling a linear impedance control (LIC) type output driver to IEEE 1149.1 boundary scan circuitry includes entering a boundary scan load mode to load a test pattern into a chain of boundary scan registers (BSRs). The test pattern includes values corresponding to output enable and data signals according to the IEEE 1149.1 standard. Then these data and output enable signals from the BSRs are converted into test "q_up" and "q_dn" signals meeting the requirements of the LIC driver. These test "q_up" and "q_dn" signals are selectively provided to the LIC driver during boundary scan testing of the LIC driver. In a further refinement, the method enters a boundary scan capture mode to capture the response (i.e., the functional q_up and q_dn signals) of the circuit under test to input test patterns shifted into the BSRs. The functional q_up and q_dn signals are converted into response data and oe signals complying with the IEEE 1149.1 specification, which are then captured in the BSRs. Thus, this method allows the widely used IEEE 1149.1 boundary scan standard to be used with LIC drivers. The resulting compatibility simplifies the testing and use of the LIC drivers, and provides a boundary scan standard for use with LIC drivers that is compliant with the IEEE 1149.1 standard.

25 Claims, 5 Drawing Sheets

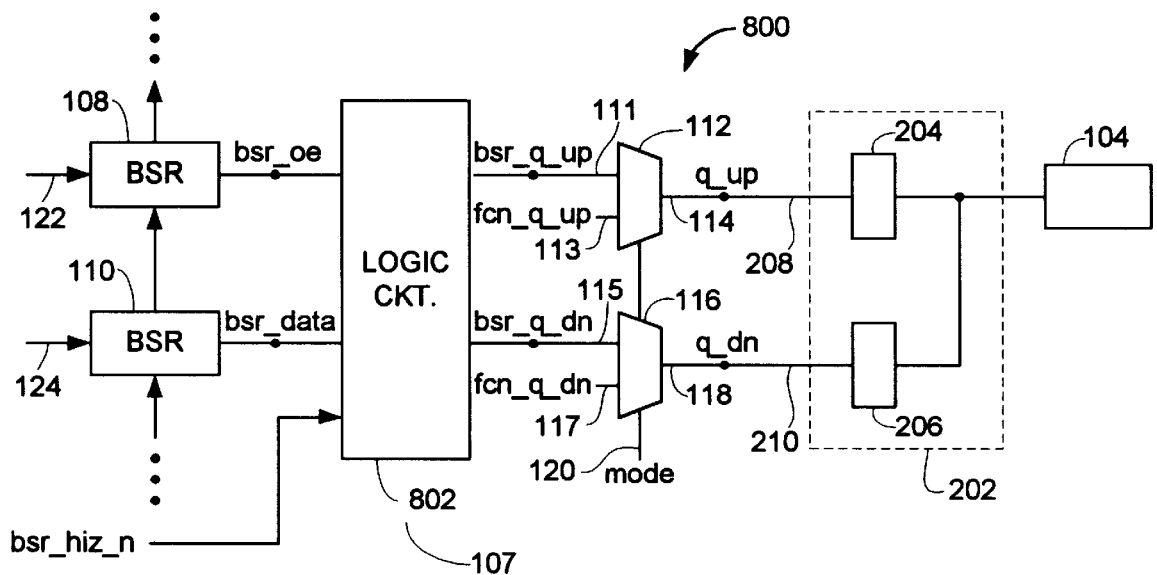
FIG. 8
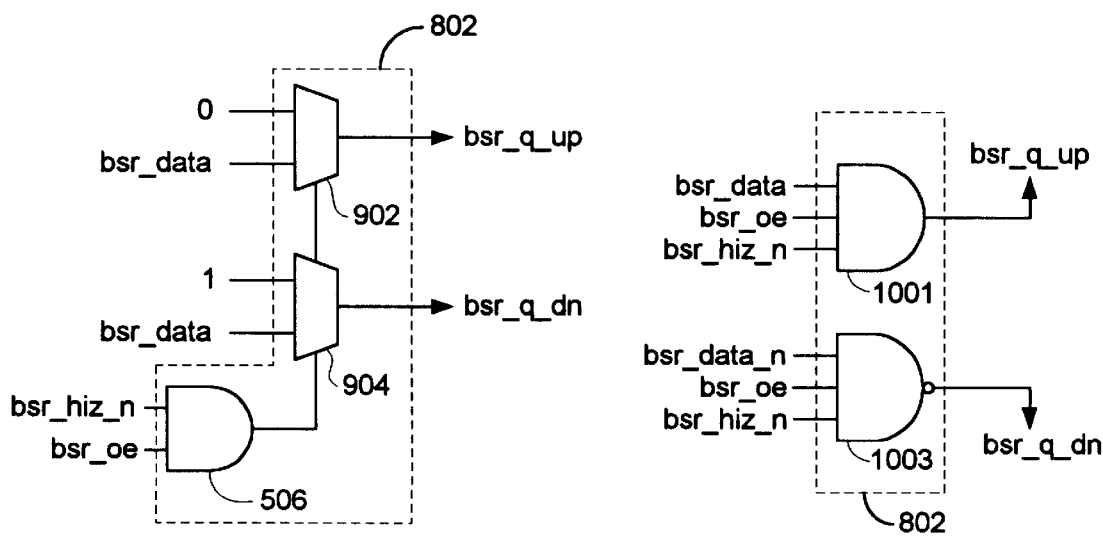
FIG. 9    FIG. 10

METHOD FOR INTERFACING BOUNDARY-SCAN CIRCUITRY WITH LINEARIZED IMPEDANCE CONTROL TYPE OUTPUT DRIVERS

FIELD OF THE INVENTION

The present invention relates to digital circuits and, more particularly, to test circuits. Still more particularly, the present invention relates to boundary-scan circuits for use with linearized impedance control type output buffers.

BACKGROUND

Many complex circuits use boundary scan testing techniques to test the output buffers of the circuit. For circuits using conventional two-state or three-state CMOS output buffers, designers commonly use the boundary scan implementation defined in the IEEE Standard Test Access Port and Boundary-Scan Architecture IEEE Std 1149.1-1990 and IEEE Std 1149.1a-1993 (referred to herein as the IEEE 1149.1 Specification or Standard), which is incorporated herein by reference. As is well known, a boundary scan implementation allows for testing of interconnects in a board environment by loading or "scanning in" test patterns into a series of interconnected boundary scan registers (BSRs). Each test pattern loaded in the BSRs provides a different set of control and data signals to the output drivers. The responses of the output drivers to the test patterns can be captured by an adjacent circuit on the board and scanned out. To run a functional test vector, an input test pattern is scanned in through the BSRs. After one or more clock cycles, the response of the circuit can then be captured in the BSRs and either scanned out or monitored at the output pads.

FIG. 1 is a circuit diagram of a portion of a circuit 100 using a conventional boundary scan implementation for I/O drivers that have three-state drivers (TSDs). The circuit 100 includes a conventional TSD 102 serving as an output driver, having an output lead connected to an I/O pad 104. The I/O pad 104 is also connected to an input lead of an input driver 105, which drives any signal received from the I/O pad 104 to other portions (not shown) of the circuit 100 in the conventional manner. The circuit 100 also includes conventional BSRs 106 and 107, which are interconnected to form part of a "scan chain" for loading test patterns and scanning out capture data. The BSR 106 includes a capture, shift and update stage (CSUS) 108 that has an output lead connected to an input lead 111 of a two-input multiplexer 112. The other input lead 113 of the multiplexer 112 is connected to receive a fcn_oe signal provided by another portion (not shown) of the circuit 100. The multiplexer 112 has an output lead 114 connected to the output enable lead of the TSD 102.

Similarly, the CSUS 110 has an output lead connected to an input lead 115 of another two-input multiplexer 116. The other input lead 117 of the multiplexer 116 is connected to receive a fcn_data signal provided by another portion (not shown) of the circuit 100. The multiplexer 116 has an output lead 118 connected to an input lead of the TSD 102.

In operation during the boundary scan mode, the CSUSs 108 and 110 are loaded with a test pattern in the conventional manner (see the aforementioned 1149.1 specification). The test pattern is predetermined so that the CSUS 108 is loaded with a value for enabling or disabling the TSD 102, as desired. Thus, the CSUS 108 provides a bsr_oe signal to the multiplexer 112. Similarly, the CSUS 110 is loaded with a desired value for the data signal to be provided to the input lead of the TSD 102. Thus, the CSUS 110 provides a bsr_data signal to the multiplexer 116. The multiplexers 112 and 116 receive a mode signal via a line 120 that causes the multiplexers 112 and 116 to select the bsr_oe and bsr_data signals. A test access port (TAP) controller according to the 1149.1 specification typically provides this mode signal. Accordingly, the TSD 102 is controlled as desired by the test pattern loaded into the BSRs to test one of the various functions of the I/O driver. The output signal provided by the TSD 102 could then be monitored at the I/O pad 104 and compared to the expected result. Other test patterns may then be loaded to test other functions of the I/O drivers.

To test the input portion of the I/O driver, a test signal can be externally provided to the I/O pad 104. The driver 106 then drives the test signal to the rest of the circuit 100 (not shown). The response of the circuit 100 can then be captured in the BSRs. The capture data can then be scanned out from the BSRs and compared to the expected response. In this example, the CSUS 108 and 110 receive capture data through input leads 122 and 124, respectively.

During the functional mode, the mode signal is configured to cause the multiplexers 112 and 116 to select the fcn_oe signal and the fcn_data signal instead of the bsr_oe and bsr_data signals. Of course, the fcn_oe and fcn_data signals are generated by the circuit 100 during normal functional operation. Consequently, the multiplexers 112 and 116 provide the fcn_oe and fcn_data signals to serve as the data and oe signals received by the TSD 102.

However, some high performance circuits such as, for example, microprocessors, have to use other types of drivers for improved performance. One type that can be used is a linearized impedance control type (LIC) driver. FIG. 2 is a circuit diagram of an example of a portion of a circuit 200 including a LIC driver 202. Note, like reference numbers are used throughout the drawings for elements that has substantially similar structure and function. The LIC driver 202 includes a pull-up unit 204 and a pull-down unit 206. The pull-up unit 204 is connected to receive a q_up signal via an input lead 208. Similarly, the pull-down unit 206 is connected to receive a q_dn signal via an input lead 210. The LIC 200 can provide the functionality (i.e., a logic zero, logic one and high impedance state) of a conventional CMOS TSD through appropriate control of the logic levels of the q_up and q_dn signals, as summarized in Table 1 below.

TABLE 1

| q_up | q_dn | LIC out |
|---|---|---|
| 0 | 0 | 0 |
| 0 | 1 | Z |
| 1 | 0 | Illegal |
| 1 | 1 | 1 |

The "Z" in Table 1 indicates a high impedance state. As is well known in the art of LIC drivers, the q_up and q_dn signals must be generated so that the q_up signal is not at a logic one level at the same time the q_dn signal is at a logic zero level.

It is appreciated that the q_up and q_dn signals of the LIC driver are not equivalent to the data and oe signals of a conventional CMOS TSD. That is, the oe and data signals cannot simply be replaced by the q_up (or q_dn) signals in an I/O driver using a LIC driver. Thus, circuits using boundary scan implementations according to the IEEE 1149.1 specification cannot be used with circuits having LIC drivers. However, because the IEEE 1149.1 standard is widely used in the industry, there is a need for a system that allows LIC drivers to be used with boundary scan implementations according to the IEEE 1149.1 specification.

SUMMARY

In accordance with the present invention, a circuit is provided for coupling a LIC driver to a boundary scan implementation. In one embodiment adapted for the IEEE 1149.1 boundary scan standard, the circuit includes a logic circuit that converts the data and oe signals of the IEEE 1149.1 specification to q_up and q_dn signals meeting the requirements of the LIC driver. In a further refinement, the logic circuit also converts functional q_up and q_dn signals provided by the circuit under test to the data and oe signals of the IEEE 1149.1 specification. This feature is advantageously used to capture data into the BSRs of the IEEE 1149.1 boundary scan implementation. As a result, the logic circuit allows the widely used IEEE 1149.1 boundary scan standard to be used with LIC drivers. The resulting compatibility simplifies the testing and use of the LIC drivers, and develops a new boundary scan standard for use only with LIC drivers that is compliant with the IEEE 1149.1 standard.

In a particular implementation of the above embodiment, the logic circuit includes a first logic circuit for converting the data and oe signals from the CSUSs to q_up and q_dn signals. The logic circuit also includes a second logic circuit for converting the functional q_up and q_dn signals (i.e., generated by the circuit under test) into "response" oe and data signals to be captured in the BSRs. The first and second logic circuits of the logic circuit thereby allow the IEEE 1149.1 boundary scan standard to be used with LIC drivers in a manner that is transparent to boundary scan tester.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 8 is a circuit diagram of a boundary scan-to-LIC logic circuit, in accordance with one embodiment of the present invention;

FIG. 9 is a circuit diagram of one embodiment of the boundary scan-to-LIC logic circuit of FIG. 8, in accordance with the present invention; and FIG. 10 is a circuit diagram of another embodiment of the boundary scan-to-LIC logic circuit of FIG. 8, in accordance with the present invention.

DETAILED DESCRIPTION

Figure 3:
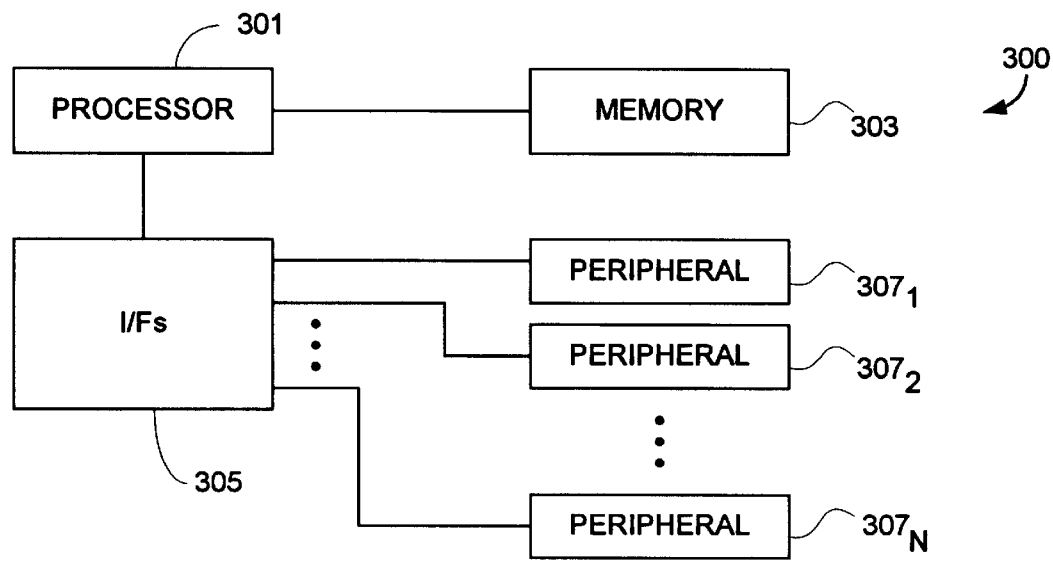
FIG. 3 is a block diagram of an electronic system having a logic circuit for use with a linearized impedance control type output driver, in accordance with one embodiment of the present invention.

FIG. 3 is a block diagram of an electronic system 300 according to one embodiment of the present invention. The electronic system 300 includes an integrated circuit 301 with a logic circuit for interfacing boundary scan circuitry with a linearized impedance control type output driver, a memory 303, interfaces 305 and peripherals $307_1$–$307_N$.

The electronic system 300 can be any type of electronic system. In this embodiment, the electronic system 300 is a computer system in which the integrated circuit 301 is a processor connected to the memory 303 and to interfaces 305. The processor can be any type of processor such as, for example, Pentium®, X86, Sparc®, Alpha®, MIPS®, HP®, and PowerPC® processors. The interfaces 205 are connected to peripherals $307_1$–$307_N$, thereby allowing the processor to interact with these peripherals. The memory 303 and the interfaces 305 can be any type of memory or interface for use in computer systems. Likewise, the peripherals can be any type of peripheral such as, for example, displays, mass storage devices, keyboards or any other type of input or input-output device. In accordance with the present invention, the logic circuit used in the integrated circuit 301 allows IEEE 1149.1 boundary scan circuitry to be used with a linearized impedance control type of output driver.

Figure 4:
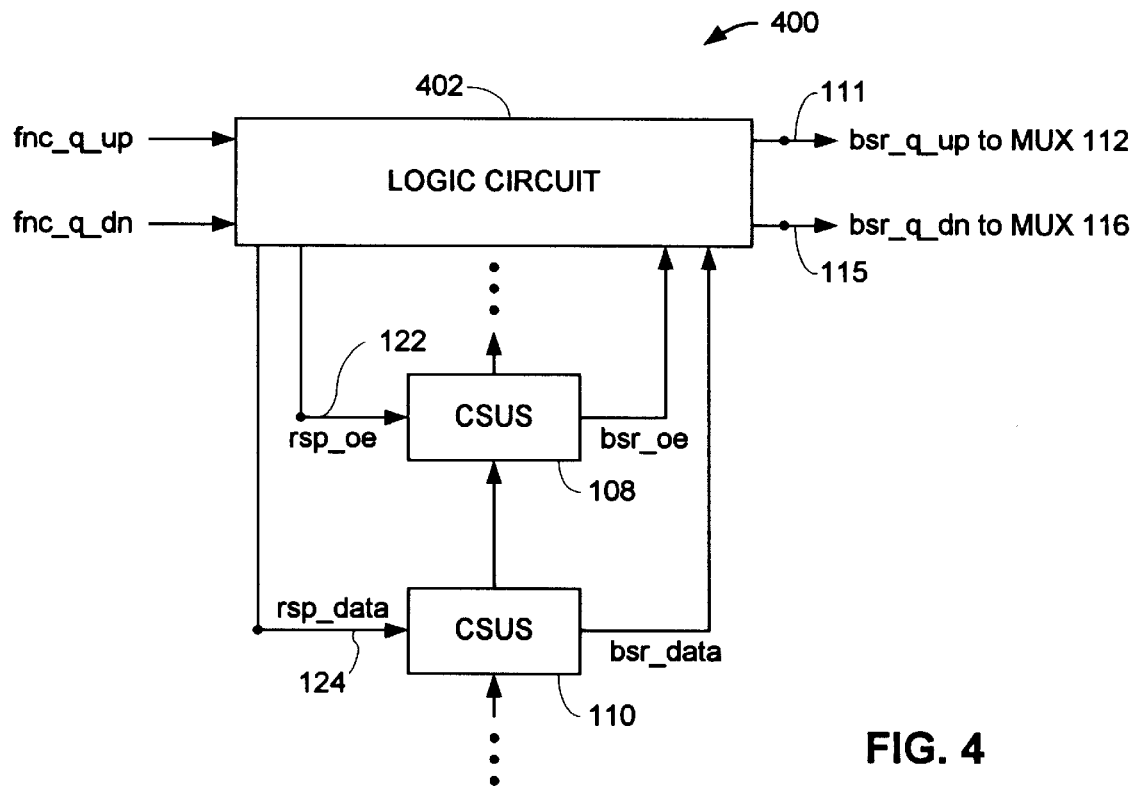
FIG. 4 is a circuit diagram of a portion of a circuit with a logic circuit for use with a linearized impedance control type output driver, in accordance with one embodiment of the present invention.

FIG. 4 is a circuit diagram of a portion of a logic circuit 400 that includes a logic circuit 402 for coupling LIC drivers to IEEE 1149.1 standard BSRs, in accordance with one embodiment of the present invention. The logic circuit 402 is connected to receive the bsr_oe and bsr_data signals from the CSUSs 108 and 110 of the BSRs 106 and 107. The logic circuit 402 is also connected to receive the "functional" (i.e., generated by the circuit 400 during normal functional operation) q_up and q_dn signals. The logic circuit 402 outputs a signal bsr_q_up, a signal bsr_q_dn, a signal rsp_oe and a signal rsp_data.

Figure 2:
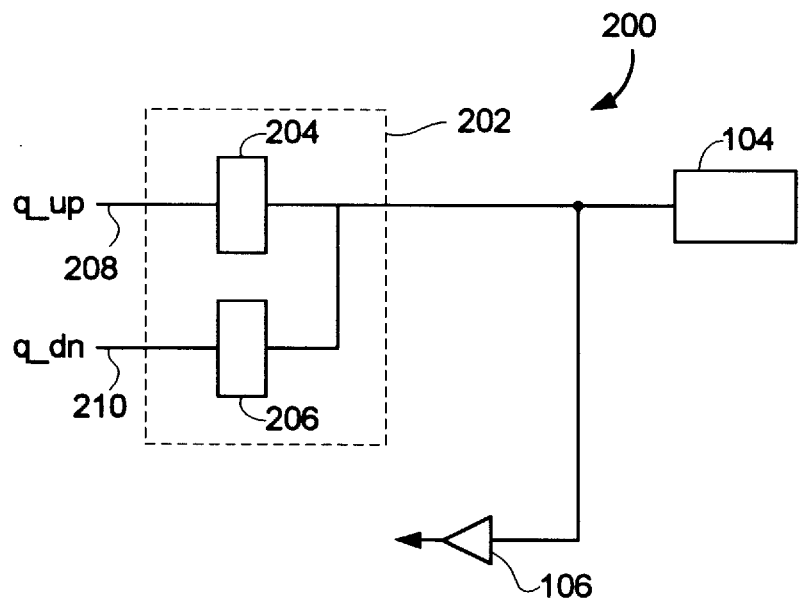
FIG. 2 is a circuit diagram of a portion of a circuit with a conventional linearized impedance control type output driver.
Figure 5A:
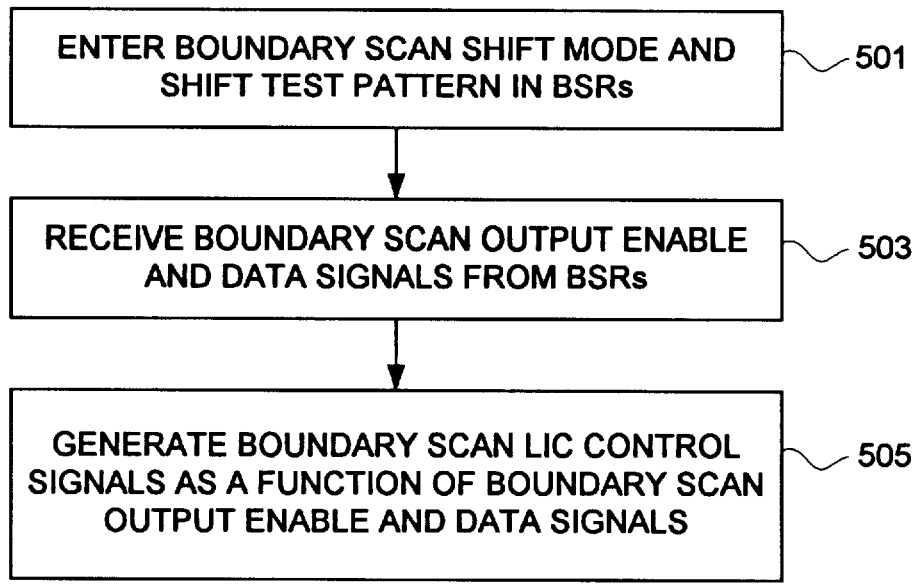
FIGS. 5A and 5B are flow diagrams illustrative of the operation of the logic circuit of FIG. 4.
Figure 5B:
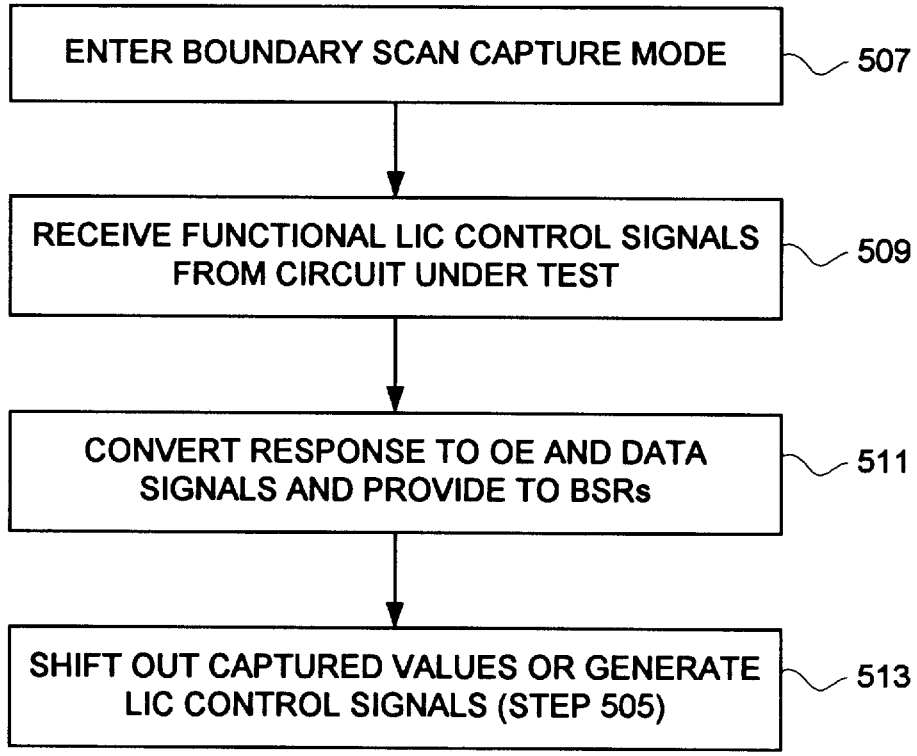

FIGS. 5A and 5B are flow diagrams illustrative of the operation of the logic circuit 402 (FIG. 4). Referring to FIGS. 4–5B, the logic circuit 402 operates as follows. In a step 501 (FIG. 5A), the logic circuit 402 enters a boundary scan "shift" mode in which a test pattern is shifted into the BSRs in the conventional manner. As previously described, the test pattern includes values stored in the CSUSs 108 and 110 for "setting" the output enable and data signals to predetermined logic levels to test the functionality of the LIC driver 202 (FIG. 2).

In a step 503 (FIG. 5A), the logic circuit 402 receives the output enable (i.e., bsr_oe) signal and the data (i.e., bsr data) signal from the CSUSs 108 and 110. In a next step 505 (FIG. 5A), the logic circuit 402 converts the signals bsr_oe and bsr_data from the CSUSs 108 and 110 into q_up and q_dn signals (i.e., the bsr_q_up and bsr_q_dn signals), respectively. More specifically, for this "boundary scan-to-LIC" feature, the logic circuit 402 implements the truth table shown below in Table 2.

TABLE 2

| bsr_data | bsr_oe | bsr_q_up | bsr_q_dn | LIC out |
|---|---|---|---|---|
| 0 | 1 | 0 | 0 | 0 |
| X | 0 | 0 | 1 | Z |
| 1 | 1 | 1 | 1 | 1 |

Figure 1:
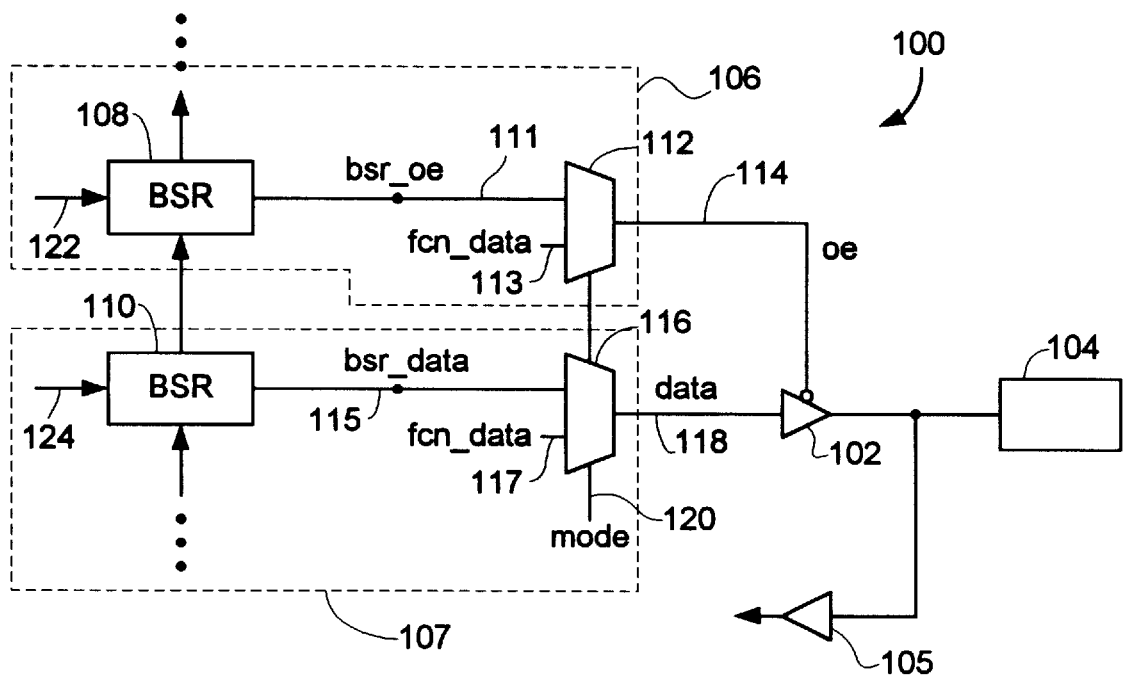
FIG. 1 is a circuit diagram of a portion of a circuit with a conventional boundary-scan implementation.

The X and Z in Table 2 respectively indicate a "don't care" and a high impedance condition. The logic circuit 402 provides the bsr_q_up and bsr_q_dn signals on output leads that are respectively connected to the input leads 111 and 115 of the multiplexers 112 and 116 (FIG. 1). As summarized in Table 2, the mapping of the bsr_data and bsr_oe signals into the bsr_q_up and bsr_q_dn signals omits the illegal condition of the bsr_q_up signal being at a logic one level at the same time that the bsr_q_dn signal is at a logic zero level. Particular embodiments of circuitry implementing the functionality of Table 2 are described below in conjunction with FIGS. 8–10. Of course, in light of the present disclosure, those skilled in the art of digital circuits can design many other circuits that implement the functionality of Table 2 without undue experimentation.

Conversely, during boundary scan testing of the function of the circuit 400, the logic circuit 402 enters a boundary scan capture mode during a step 507 (FIG. 5B). In a next step 509 FIG. 5B), the logic circuit 402 receives the functional LIC control signals (i.e., fcn_q_up and fcn_q_dn) resulting from the test pattern. Then in a step 511 (FIG. 5B), the logic circuit 402 converts the fcn_q_up and fcn_q_dn signals into "response" oe and data signals (i.e., the rsp_oe and rsp_data signals) to be captured in the CSUS 108 and 110 in the conventional manner. More specifically, for this "LIC-to-boundary scan" feature, the logic circuit 402 implements the truth table shown below in Table 3.

TABLE 3

| fcn_q_up | fcn_q_dn | rsp_data | rsp_oe |
|---|---|---|---|
| 0 | 0 | 0 | 1 |
| 0 | 1 | X | 0 |
| 1 | 1 | 1 | 1 |

The X in Table 3 indicates a "don't care" condition. The logic circuit 402 provides the signals rsp_oe and rsp_data on output leads that are respectively connected to the input leads 122 and 124 of the CSUS 108 and 110. As summarized in Table 3, the mapping of the fcn_q_up and fcn_q_dn signals into the rsp_data and rsp_oe signals does not include the illegal condition of the fcn_q_up signal being at a logic one level at the same time that the fcn_q_dn signal is at a logic zero level. Particular embodiments of circuitry implementing the functionality of Table 3 are described below in conjunction with FIGS. 6 and 7. Of course, in light of the present disclosure, those skilled in the art of digital circuits can design many other circuits that implement the functionality of Table 3 without undue experimentation. Then in a next step 513, the response signals rsp_oe and rsp_data are shifted out of the BSRs in the conventional manner. Alternatively, the step 505 may be performed so that the captured values are used to generate LIC control signals, which causes LIC drivers to output the response.

Figure 6:
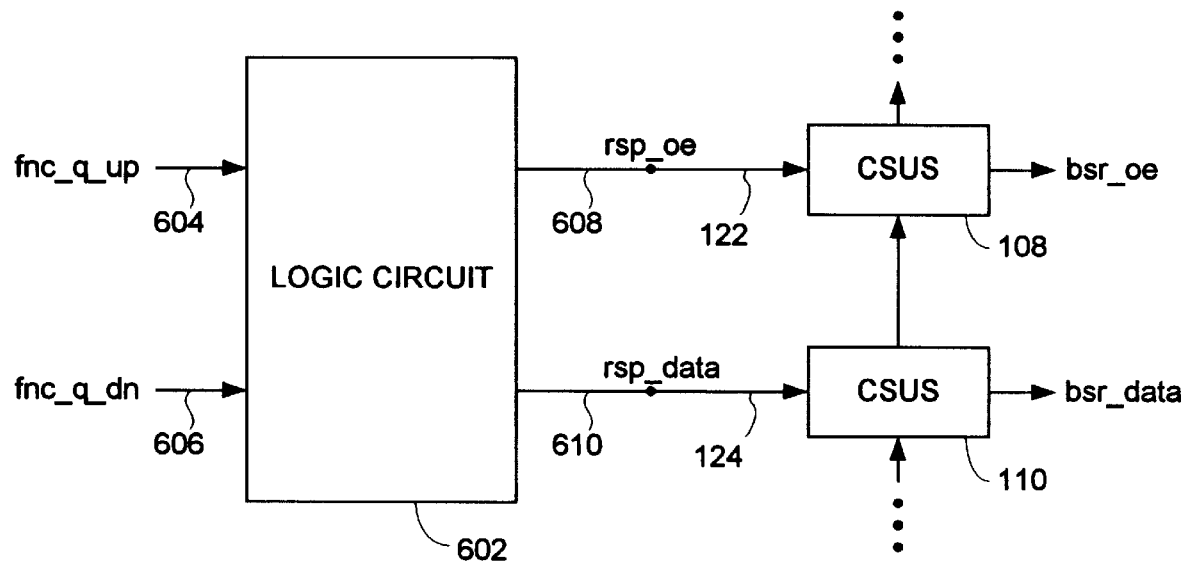
FIG. 6 is a circuit diagram of an LIC-to-boundary scan logic circuit, in accordance with one embodiment of the present invention.

FIG. 6 is a circuit diagram of an LIC-to-boundary scan (LIC-BSR) logic circuit 602, in accordance with one embodiment of the present invention. In this embodiment, the LIC-BSR logic circuit 602 forms part of the logic circuit 402 (FIG. 4) to implement the aforementioned "LIC-to-boundary scan" feature. The LIC-BSR logic circuit 602 has input leads 604 and 606 and output leads 608 and 610. The input leads 604 and 606 are respectively connected to receive the signals fcn_q_up and fcn_q_dn generated by the circuit 800 during normal functional operation. The output leads 608 and 610 are respectively connected to the input leads 122 and 124 of the CSUS 108 and 110. The LIC-BSR logic circuit 602 operates during the boundary scan mode to convert the signals fcn_q_up and fcn_q_dn into the signals rsp_oe and rsp_data (conforming to the IEEE 1149.1 specification) to be captured in the CSUS 108 and 110. More specifically, the LIC-BSR logic circuit 602 implements the truth table shown below in Table 5. In this way, the LIC-BSR logic circuit 602 serves to make the IEEE 1149.1 boundary scan standard interoperable with the LIC driver 202.

TABLE 5

| fcn_q_up | fcn_q_dn | rsp_data | rsp_oe |
|---|---|---|---|
| 0 | 0 | 0 | 1 |
| 0 | 1 | X | 1 |
| 1 | 1 | 1 | 1 |

The X indicates a "don't care" condition. As summarized in Table 5, the mapping of the signals fcn_q_up and fcn_q_dn into the signals rsp_data and rsp_oe omits the illegal condition of the fcn_q_up signal being at a logic one level at the same time that the fcn_q_dn signal is at a logic zero level. A particular embodiment of a circuit implementing the functionality of Table 5 is described below in conjunction with FIG. 7. Of course, in light of the present disclosure, those skilled in the art of digital circuits can design many other circuits that implement the functionality of Table 5 without undue experimentation.

Figure 7:
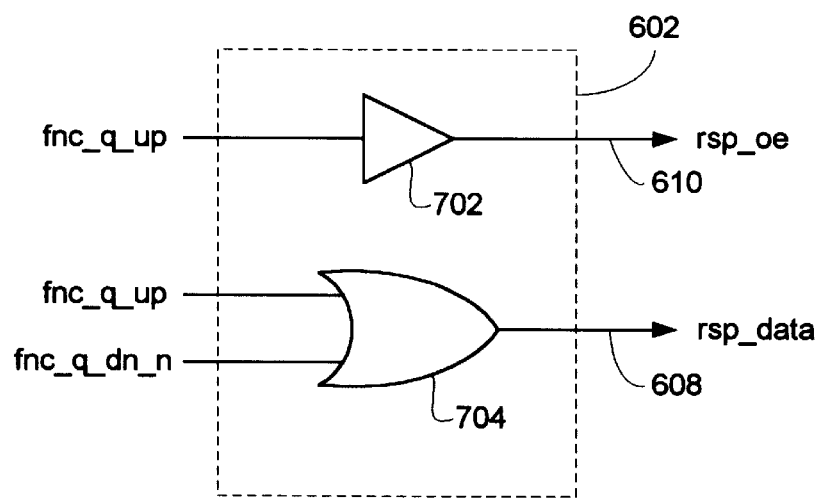
FIG. 7 is a circuit diagram of the LIC-to-boundary scan logic circuit of FIG. 6, according to one embodiment of the present invention.

FIG. 7 is a circuit diagram of the LIC-BSR logic circuit 602 (FIG. 6), according to one embodiment of the present invention. In this embodiment, the LIC-BSR logic circuit 602 includes a non-inverting buffer 702 and a two-input OR gate 704. The buffer 702 has an input lead connected to receive the signal fcn_q_up and has an output that serves as the output lead 610 FIG. 6) of the LIC-BSR logic circuit 602. The OR gate 704 has one input lead connected to receive the signal fcn_q_up and has another input lead connected to receive the signal fcn_q_dn. The output lead of the OR gate 704 serves as the output lead 608 (FIG. 6) of the LIC-BSR logic circuit 602.

This embodiment of the LIC-BSR logic circuit 602 operates as follows. When the signals fcn_q_up and fcn_q_dn are both at logic zero levels, (i) the buffer 702 outputs the signal rsp_data with a logic zero level to be captured in the CSUS 110 (FIG. 6), and (ii) the OR gate 704 outputs the signal rsp_oe with a logic one level to be captured in the CSUSS 108 (FIG. 6). Thus, in this case, this embodiment of the LIC-BSR logic circuit 602 conforms to the first row of Table 5.

When the signal fcn_q_up is at a logic zero level and the signal fcn_q_dn is at a logic one level, the buffer 702 outputs the signal rsp_data with a logic zero level while the OR gate 704 outputs the signal rsp_oe with a logic one level. Thus, in this case, this embodiment of the LIC-BSR logic circuit 602 conforms to the second row of Table 5.

Then, when the signal fcn_q_up is at a logic one level and the signal fcn_q_dn is at a logic one level, the buffer 702 and the OR gate 704 output the signals rsp_data and rsp_oe with logic one levels. Thus, in this case, this embodiment of the LIC-BSR logic circuit 602 conforms to the third row of Table 5.

FIG. 8 is a circuit diagram of a portion of a circuit 800 having a boundary scan-to-LIC (also referred to herein as "BSR-LIC") logic circuit 802, in accordance with one embodiment of the present invention. In this embodiment, the BSR-LIC logic circuit 802 forms part of the logic circuit 402 (FIG. 4) to implement the aforementioned "boundary scan-to-LIC" feature. The boundary scan implementation used in the circuit 800 is substantially similar to the boundary scan implementation used in the circuit 400 (FIG. 4), except that in the circuit 800, the boundary scan implementation also supports a high impedance signal hiz. More specifically, the boundary scan implementation in the circuit 800 also supports the optional high impedance signal of the IEEE 1149.1 standard. The signal hiz is a global signal that can be used to configure several LIC drivers into the high impedance state using a single signal (i.e., without having to set several pairs of q_up and q_dn signals).

In particular, the BSR-LIC logic circuit 802 is connected to receive the signal bsr_oe from the CSUS 108, the signal bsr_data from the CSUS 110 and a signal bsr_hiz_n. The signal bsr_hiz_n is used during boundary scan testing and corresponds to the complement of a signal hiz typically provided by a TAP controller (not shown) compliant with the IEEE 1149.1 standard. The CSUSs 108 and 110 form part of a "scan chain" in the boundary scan implementation. Although in this embodiment the signals bsr_oe and bsr_data are provided from adjoining BSRs, it will be appreciated that these signals can be provided from non-adjoining BSRs as well. Further, in other embodiments, the bsr_hiz_n signal may be replaced with a bsr_hiz signal, with the inversion performed in the BSR-LIC logic circuit 802.

The BSR-LIC logic circuit 802 has an output lead connected to the input lead 111 of the multiplexer 112, through which the BSR-LIC logic circuit 802 outputs the signal bsr_q_up. The other input lead 113 of the multiplexer 112 is connected to receive the "functional" q_up signal (i.e., signal fcn_q_up) generated by the circuit 800 during normal functional operation. In addition, the BSR-LIC logic circuit 802 has another output lead connected to the input lead 115 of the multiplexer 116 through which the BSR-LIC logic circuit 802 outputs the signal bsr_q_dn. The other input lead 117 of the multiplexer 116 is connected to receive the "functional" q_dn signal (i.e., signal fcn_q_dn) generated by the circuit 800 during normal functional operation.

This portion of the circuit 800 operates as follows. During the boundary scan mode, the BSR-LIC logic circuit 802 receives the signals bsr_oe and bsr_data from the CSUSs 108 and 110 and the signal bsr_hiz_n from the TAP controller (not shown). The BSR-LIC logic circuit then converts the signals bsr_oe, bsr_data and bsr_hiz_n into the signals bsr_q_up and bsr_q_dn that are used by the LIC driver 202. This conversion is performed so that the LIC driver 202 responds to the signals bsr_oe, bsr_data and bsr_hiz_n in the same way that a conventional CMOS TSD would respond. For example, when the signal bsr_oe is deasserted during boundary scan testing, the BSR-LIC circuit 802 causes the signals bsr_q_up and bsr_q_dn to be at logic zero and logic one levels, respectively. Consequently, the LIC driver 202 enters a high impedance output state. Also, when the signal bsr_hiz_n is at a logic one level, the BSR-LIC logic circuit functions in response to the signals bsr_oe and bsr_data as described above in conjunction with Table 2. However, when the signal bsr_hiz_n is at a logic zero level during boundary scan testing, the BSR-LIC logic circuit 802 causes the signals bsr_q_up and bsr_q_dn to be at logic zero and logic one levels, respectively, which causes the LIC driver 202 to enter a high impedance output state. More specifically, the BSR-LIC logic circuit 802 implements the truth table shown below in Table 4.

TABLE 4

| bsr_data | bsr_oe | bsr_hiz_n | bsr_q_up | bsr_q_dn | LIC out |
|---|---|---|---|---|---|
| 0 | 1 | 1 | 0 | 0 | 0 |
| X | 0 | 1 | 0 | 1 | Z |
| 1 | 1 | 1 | 1 | 1 | 1 |
| X | X | 0 | 0 | 1 | Z |

The Xs indicate "don't care" conditions whereas the Zs indicate a high impedance state. As summarized in Table 4, the mapping of the signals bsr_hiz_n, bsr_data and bsr_oe into the signals bsr_q_up and bsr_q_dn omits the illegal condition of the bsr_q_up signal being at a logic one level at the same time that the bsr_q_dn signal is at a logic zero level. Particular embodiments of circuitry implementing the functionality of Table 4 are described below in conjunction with FIGS. 9–10. Of course, in light of the present disclosure, those skilled in the art of digital circuits can design many other circuits that implement the functionality of Table 4 without undue experimentation.

FIG. 9 is a circuit diagram of one embodiment of the BSR-LIC logic circuit 802 (FIG. 8), in accordance with the present invention. In this implementation, the BSR-LIC logic circuit 802 includes two-input multiplexers 902 and 904 and a two-input AND gate 906. The AND gate 906 is connected to receive from the CSUS 108 and 804 (FIG. 8) the signal bsr_oe and the inverse of the high impedance control signal hiz (i.e., bsr_hiz_n). The output lead of the AND gate 906 is connected to the select input leads of the multiplexers 902 and 904. Accordingly, the output signal generated by the AND gate 906 serves as the select signal for the multiplexers 902 and 904.

In addition, the multiplexer 902 is connected to receive a logic zero signal on one input lead. In this embodiment, the logic zero signal is hardwired. The multiplexer 902 is also connected to receive at its other input lead the signal bsr_data from the CSUS 110 (FIG. 8). The output signal of the multiplexer 902 serves as the signal bsr_q_up. Similarly, the multiplexer 904 is connected to receive a hardwired logic one signal at one input lead and the bsr_data signal at the other input lead. The output signal of the multiplexer 904 serves as the signal bsr_q_dn. Both multiplexers are configured to select the signal bsr_data when the select signal from the AND gate 906 is at a logic one level. Consequently, the multiplexers select the hardwired signal when the AND gate 906 outputs a logic high level signal.

This embodiment of the BSR-LIC logic circuit 802 operates as follows. When both the signal bsr_hiz_n and the signal bsr_oe are at logic one levels (i.e., the driver is enabled and the "global" high impedance state is not selected), the AND gate 906 will output the select signal with a logic one level to the multiplexers 902 and 904. As a result, the multiplexers select the signal bsr_data. Conversely, when either signal bsr_oe or signal bsr_hiz is at a logic zero level (i.e., the driver is disabled or the "global" high impedance state is selected), the AND gate 906 will generate the select signal with a logic zero level. Thus, the BSR-LIC logic circuit 802 outputs the signals bsr_q_up and bsr_q_dn with logic zero and logic one levels, respectively. Consequently, the LIC driver 202 will enter the high impedance state. Accordingly, this embodiment of the BSR-LIC logic circuit 802 implements the truth table of Table 8.

FIG. 10 is a circuit diagram of another embodiment of the BSR-LIC logic circuit 802 (FIG. 8), in accordance with the present invention. This embodiment includes a three-input AND gate 1001 and a three-input NAND gate 1003. The AND gate 1001 is connected to receive the signals bsr_data, bsr_oe and bsr_hiz_n. The output signal generated by the AND gate 1001 serves as the signal bsr_q_up received by the multiplexer 112 (FIG. 8).

The NAND gate 1003 is connected to receive the signals bsr_data_n (i.e., the complement of the signal bsr_data), bsr_oe and bsr_hiz_n. Of course, in other embodiments, an inverter may be included to generate the signal bsr_data_n from the signal bsr_data. The output signal generated by the NAND gate 1003 serves as the signal bsr_q_dn received by the multiplexer 116 (FIG. 8).

This embodiment of the BSR-LIC logic circuit 802 operates as follows. When either the signal bsr_oe or the signal bsr_hiz_n is at a logic low level, (i) the AND gate 1001 will output the signal bsr_q_up at a logic zero level, and (ii) the NAND gate 1003 will output the signal bsr_q_dn at a logic one level. As a result of the signals bsr_q_up and bsr_q_dn being at logic zero and logic one levels, respectively, the LIC driver 202 (FIG. 8) will enter a high impedance state.

In contrast, when the signals bsr_oe and bsr_hiz_n are both at logic one levels, the AND gate 1001 is, in effect, equivalent to a non-inverting buffer receiving the signal bsr_data. Thus, in this situation, the signal bsr_q_up is equivalent to the signal bsr_data. Likewise, the NAND gate 1003 is, in effect, equivalent to an inverter receiving the signal bsr_data_n. Because of the two inversions, the NAND gate 1003 outputs the signal bsr_q_dn having the same logic level as the signal bsr_data. Accordingly, this embodiment of the BSR-LIC logic circuit 802 implements the truth table of Table 8.

The embodiments of the circuit described above are illustrative of the principles of this invention and are not intended to limit the invention to the particular embodiments described. For example, in light of the present disclosure, those skilled in the art of boundary scan circuits can implement other embodiments adapted for use with other boundary scan standards without undue experimentation. In addition, switching devices other than the multiplexers described may be used in other embodiments. Accordingly, while the preferred embodiment of the invention has been illustrated and described, it will be appreciated that in view of the present disclosure, various changes can be made therein without departing from the spirit and scope of the invention.

We claim:

1. A method for adapting boundary scan test circuitry for use with a linear impedance control (LIC) type driver, the method comprising:

entering a boundary scan load mode, wherein a test pattern is loaded into a first boundary scan register (BSR) and a second BSR, said first BSR storing a test pattern value corresponding to value of a first boundary scan signal provided by said first BSR, and said second BSR storing a test pattern value corresponding to a value of a second boundary scan signal provided by said second BSR;

receiving said first boundary scan signal from said first boundary scan register (BSR) and said second boundary scan signal from said second BSR;

generating a first LIC control signal and a second LIC control signal as a function of said first and second boundary scan signals, wherein said first and second LIC control signals cause said LIC driver to provide a function equivalent to a response of a boundary scan driver to said first and second boundary scan signals.

2. The method of claim 1 wherein said boundary scan circuitry complies with IEEE Standard Test Access Port and Boundary-Scan Architecture IEEE Std 1149.1-1990.

3. The method of claim 1 wherein said first boundary scan signal is an output enable signal and said second boundary scan signal is a data signal.

4. The method of claim 1 wherein generating said first and second LIC control signals comprises:

generating said first LIC control signal by performing a logical AND operation of said first boundary scan signal and said second boundary scan signal; and generating said second LIC control signal by performing a logical NAND operation of said first boundary scan signal and a complement of said second boundary scan signal.

5. The method of claim 1 wherein generating said first and second LIC control signals comprises:

generating said first LIC control signal by performing a logical AND operation of said first boundary scan signal, said second boundary scan signal and a third boundary scan signal, wherein said third boundary scan signal is operative to configure said LIC driver into a high impedance state independently of a logic level of said first boundary scan signal; and generating said second LIC control signal by performing a logical NAND operation of said first boundary scan signal, a complement of said second boundary scan signal and said third boundary scan signal.

6. The method of claim 1 wherein generating said first and second LIC control signals comprises:

generating said first LIC control signal by providing said second boundary scan signal when said first boundary scan signal is at a first logic level and providing a signal with a second logic level when said first boundary scan signal is at said second logic level; and generating said second LIC control signal by providing said second boundary scan signal when said first boundary scan signal is at said first logic level and providing a signal with said first logic level when said first boundary scan signal is at said second logic level.

7. The method of claim 1 wherein generating said first and second LIC control signals comprises:

generating a select signal having a logic level equivalent to a logical AND operation of said first boundary scan signal and a third signal, wherein said third signal is operative to configure said LIC driver into a high impedance state independently of a logic level of said first boundary scan signal;

generating said first LIC control signal by providing said second boundary scan signal when said select signal has a first logic level and providing a signal with a second logic level when said select signal is at said second logic level; and generating said second LIC control signal by providing said second boundary scan signal when said select signal is at said first logic level and providing a signal with said first logic level when said first select signal is at said second logic level.

8. The method of claim 1 further comprising:

entering a boundary scan capture mode, wherein a capture mode test pattern is provided at a plurality of I/O pads;

receiving a first functional LIC control signal and a second functional LIC control signal, said first and second functional control signals having logic levels dependent on said capture mode test pattern;

generating a first response boundary scan signal and a second response boundary scan signal as a function of said first and second functional LIC control signals, wherein said first and second response boundary scan signals correspond to boundary scan signals that would cause a boundary scan driver to provide a function equivalent to a response of said LIC driver to said first and second functional LIC control signals.

9. The method of claim 8 wherein said generating said first and second response boundary scan signals comprises:

generating said second response boundary scan signal by providing a signal equivalent to said first functional LIC control signal; and generating said first response boundary scan signal by performing a logical OR operation of said first functional LIC control signal and said a complement of second functional LIC control signal.

10. A computer system comprising:

a memory;

an interface;

a plurality of peripherals coupled to said interface; and a processor coupled to said memory and said interface, wherein said processor includes a circuit for adapting boundary scan test circuitry for use with a linear impedance control (LIC) type driver, the circuit comprising:

a logic circuit coupled to a first boundary scan subcircuit and a second boundary scan subcircuit, wherein said logic circuit is configured to output:

a first LIC control signal and a second LIC control signal as a function of an output enable signal from said first boundary scan subcircuit and a data signal from said second boundary scan subcircuit, and a response output enable signal and a response data signal as a function of a first functional LIC control signal and a second functional LIC control signal;

a first multiplexer coupled to receive said first LIC control signal from said logic circuit, said first multiplexer having an output lead coupled to said LIC driver; and a second multiplexer coupled to receive said second LIC control signal from said logic circuit, said second multiplexer having an output lead coupled to said LIC driver.

11. The computer system of claim 10 wherein said logic circuit comprises:

a first input lead coupled to an output lead of said first boundary scan subcircuit:

a second input lead coupled to an output lead of said second boundary scan subcircuit;

a third input lead coupled to receive said output enable signal from said first boundary scan subcircuit;

a fourth input lead coupled to received said data signal from said second boundary scan subcircuit;

a first output lead coupled to said first multiplexer, said logic circuit being configured to output said first LIC control signal on said first output lead, a second output lead coupled to said second multiplexer, said logic circuit being configured to output said second LIC control signal on said second output lead;

a third output lead coupled to an input lead of said first boundary scan subcircuit, said logic circuit being configured to output said response output enable signal on said third output lead; and a fourth output lead coupled to an input lead of said second boundary scan subcircuit, said logic circuit being configured to output said response data signal on said fourth output lead.

12. The computer system of claim 10 wherein said logic circuit comprises a first logic circuit, said first logic circuit being configured to provide said first LIC control signal on a first output lead and configured to provide said second LIC control signal on a second output lead.

13. The computer system of claim 12 wherein said first logic circuit comprises:

a third multiplexer having a first input lead coupled to receive a logic zero signal and having a second input lead coupled to receive said data signal from said second boundary scan subcircuit, said third multiplexer having an output lead coupled to said first output lead of said first logic circuit;

a fourth multiplexer having a first input lead coupled to receive a logic one signal and having a second input lead coupled to receive said data signal from said second boundary scan subcircuit, said fourth multiplexer having an output lead coupled to said second output lead of said first logic circuit; and a logic gate coupled to receive said output enable signal from said first boundary scan subcircuit, said logic gate having an output lead coupled to a select lead of said third multiplexer and a select lead of said fourth multiplexer.

14. The computer system of claim 13 wherein said logic gate comprises an AND gate, said logic gate further coupled to receive a high impedance mode signal, said high impedance mode signal having a logic zero level when said LIC driver is globally configured into a high impedance state.

15. The computer system of claim 14 wherein said first logic circuit comprises:

an AND gate having a first input lead coupled to receive said output enable signal from said first boundary scan subcircuit and having a second input lead coupled to receive said data signal from said second boundary scan subcircuit; and a NAND gate having a first input lead coupled to receive said output enable signal from said first boundary scan subcircuit and having a second input lead coupled to receive a signal equivalent to a complement of said data signal from said second boundary scan subcircuit.

16. The computer system of claim 15 wherein said AND gate and said NAND gate each has a third input lead coupled to receive a high impedance mode signal, said high impedance mode signal having a logic zero level when said LIC driver is globally configured into a high impedance state.

17. The computer system of claim 10 wherein said logic circuit comprises a second logic circuit, said second logic circuit being configured to provide said response output enable signal on a first output lead and configured to provide said response data signal on a second output lead.

18. The computer system of claim 17 wherein said second logic circuit comprises:

a buffer having an input lead coupled to receive said first functional LIC control signal and having an output lead coupled to said second output lead of said second logic circuit; and an OR gate having a first input lead coupled to receive said first functional LIC control signal and having a second input lead coupled to receive said second functional LIC control signal, said OR gate having an output lead coupled to said first output lead of said second logic circuit.

19. The computer system of claim 18 wherein said second functional LIC control signal is corresponds to a complement of said second LIC control signal from said logic circuit.

20. The computer system of claim 10 wherein said circuit is configured for use with boundary scan test circuitry according to IEEE Standard Test Access Port and Boundary-Scan Architecture IEEE Std 1149.1-1990.

21. The computer system of claim 10 wherein said first multiplexer has a second input lead coupled to receive said first functional LIC control sig and wherein said second multiplexer has a second input lead coupled to receive said second functional LIC control signal, said first and second multiplexers also having a select input lead coupled to receive a mode signal, said mode signal causing said first and second multiplexers to select said first and second functional LIC control signals when said mode signal is in a first logic state, and causing said first and second multiplexers to select said output enable and data signals from said first and second BSRs when said mode signal is in a second logic state.

22. A computer system comprising:

a memory;

an interface;

a plurality of peripherals coupled to said interface; and a processor coupled to said memory and said interface, wherein said processor includes a circuit for adapting boundary scan test circuitry for use with a linear impedance control (LIC) type driver, the circuit comprising:

means for entering a boundary scan load mode during which a test pattern is loaded into a first boundary scan boundary scan subcircuit and a second boundary scan subcircuit, said first boundary scan subcircuit storing a test pattern value corresponding to value of a first boundary scan signal provided by said first boundary scan subcircuit, and said second boundary scan subcircuit storing a test pattern value corresponding to a value of a second boundary scan signal provided by said second boundary scan subcircuit, means for receiving said first boundary scan signal from said first boundary scan register boundary scan subcircuit and said second boundary scan signal from said second boundary scan subcircuit, and means for generating a first LIC control signal and a second LIC control signal as a function of said first and second boundary scan signals, wherein said first and second LIC control signals cause said LIC driver to provide a function equivalent to a response of a boundary scan driver to said first and second boundary scan signals.

23. The computer system of claim 22 wherein said means for generating said first and second LIC control signals comprises:

means for generating a select signal having a logic level equivalent to a logical AND operation of said first boundary scan signal and a third boundary scan signal, wherein said third boundary scan signal is operative to configure said LIC driver into a high impedance state independently of a logic level of said first boundary scan signal;

means for generating said first LIC control signal by providing said second boundary scan signal when said select signal has a first logic level and providing a signal with a second logic level when said select signal is at said second logic level; and means for generating said second LIC control signal by providing said second boundary scan signal when said select signal is at said first logic level and providing a signal with said first logic level when said first select signal is at said second logic level.

24. The computer system of claim 22 wherein said circuit further comprises:

means for entering a boundary scan capture mode during which a capture mode test pattern is provided at a plurality of I/O pads;

means for receiving a first functional LIC control signal and a second functional LIC control signal, said first and second functional control signals having logic levels dependent on said capture mode test pattern;

means for generating a first response boundary scan signal and a second response boundary scan signal as a function of said first and second functional LIC control signals, wherein said first and second response boundary scan signals correspond to boundary scan signals that would cause a boundary scan driver to provide a function equivalent to a response of said LIC driver to said first and second functional LIC control signals.

25. The computer system of claim 24 wherein said means for generating said first and second response boundary scan signals comprises:

means for generating said second response boundary scan signal by providing a signal equivalent to said first functional LIC control signal; and means for generating said first response boundary scan signal by performing a logical OR operation of said first functional LIC control signal and said a complement of second functional LIC control signal.

* * * * *

UNITED STATES PATENT AND TRADEMARK OFFICE
CERTIFICATE OF CORRECTION

PATENT NO. : 5,872,796  
DATED : February 16, 1999  
INVENTOR(S) : Farideh Golshan and Marc E. Levitt Page 1 of 1

It is certified that error appears in the above-identified patent and that said Letters Patent is hereby corrected as shown below:

Column 11,
Line 20, delete "said a complement of" and substitute -- a complement of said --

Column 13,
Line 15, delete "sig" and substitute -- signal --.
Lines 37-38, delete first occurrence of "boundary scan".
Line 46, delete "," and substitute -- ; --.
Line 48, delete "boundary scan register" immediately after "first".

Column 14,
Line 51, delete "said a complement of" and substitute -- a complement of said --.

Signed and Sealed this

Seventh Day of May, 2002

Attest:

Attesting Officer

JAMES E. ROGAN
Director of the United States Patent and Trademark Office